(12) United States Patent
Rodriguez et al.

(10) Patent No.: US 11,513,155 B2
(45) Date of Patent: Nov. 29, 2022

(54) METHOD AND A DIAGNOSTICS DEVICE FOR DETERMINING A FAULT CONDITION IN A SYNCHRONOUS MOTOR

(71) Applicant: ABB Schweiz AG, Baden (CH)

(72) Inventors: Pedro Rodriguez, Västerås (SE); Subrat Sahoo, Västerås (SE); Cajetan Pinto, Mumbai (IN)

(73) Assignee: ABB Schweiz AG, Baden (CH)

( * ) Notice: Subject to any disclaimer, the term of this patent is extended or adjusted under 35 U.S.C. 154(b) by 1016 days.

(21) Appl. No.: 15/963,480

(22) Filed: Apr. 26, 2018

(65) Prior Publication Data

US 2018/0321321 A1 Nov. 8, 2018

(30) Foreign Application Priority Data

May 8, 2017 (EP) .................................. 17169903

(51) Int. Cl.
*G01R 31/34* (2020.01)
*H02P 29/024* (2016.01)

(52) U.S. Cl.
CPC .......... *G01R 31/346* (2013.01); *G01R 31/34* (2013.01); *H02P 29/024* (2013.01); *H02P 29/0241* (2016.02)

(58) Field of Classification Search
CPC .............. B60L 2220/14; H02P 29/024; H02P 29/0241; G01N 27/82; G01N 2291/2693
See application file for complete search history.

(56) References Cited

U.S. PATENT DOCUMENTS

| 4,583,031 A * | 4/1986 | Brunet ..................... H02K 7/09 |
| | | 318/632 |
| 4,761,703 A | 8/1988 | Kliman et al. |
| 4,808,932 A | 2/1989 | Schulz, Jr. et al. |
| 6,650,122 B2 * | 11/2003 | Matthews .............. G01R 31/34 |
| | | 324/545 |
| 2008/0143341 A1 | 6/2008 | Umans |
| 2011/0191034 A1 * | 8/2011 | Lee ..................... G01R 31/343 |
| | | 702/35 |
| 2015/0260794 A1 * | 9/2015 | Athikessavan ........ G01R 31/50 |
| | | 702/58 |

(Continued)

FOREIGN PATENT DOCUMENTS

| CN | 102135601 A | 7/2011 |
| EP | 2919026 A1 | 9/2015 |

OTHER PUBLICATIONS

H.C.Karmaker, Broken Damper Bar Detection Studies Using Flux Probe Measurements and Time-Stepping Finite Element Analysis For Salient-Pole Synchronous Machines, 2003, IEEE (Year: 2003).*

(Continued)

*Primary Examiner* — Thang X Le
(74) *Attorney, Agent, or Firm* — Whitmyer IP Group LLC

(57) ABSTRACT

A method and device of determining a fault condition in a synchronous motor including a rotor provided with damper bars and an end ring to which the damper bars are mechanically connected thereby forming a damper cage, wherein the method includes: obtaining a first measurement of an end ring current from a first location along the end ring, processing the first measurement to thereby obtain a processing result, and determining whether a fault condition is present in the synchronous motor based on the processing result.

20 Claims, 3 Drawing Sheets

(56) References Cited

U.S. PATENT DOCUMENTS

2016/0274192 A1* 9/2016 Zettner .................. G01K 13/08
2017/0250592 A1* 8/2017 Adachi .................. H02K 11/27

OTHER PUBLICATIONS

S.E. Zouzou et al., Detection of Inter-Turn Short-Circuit and broken Rotor Bars in Induction Motors Using the Partial Relative Indexes: Application on the MCSA, 2010, XIX International Conference on Electrical Machines (Year: 2010).*

Antonio-Daviu, Jose A., "Transient-based analysis for the detection of broken damper bars in synchronous motors", published in Mechanical Systems and Signal Processing, vol. 34, issues 1-2, Jan. 2013, pp. 367-377.

Antonio-Daviu, Jose A., et al., "Reporting false indications of startup analysis when diagnosing damper damages in synchronous motors", Industrial Informatics (INDIN), 6 IEEE TH International Conference, Jul. 19, 2016, pp. 434-438.

Dehong Liu, et al: "Off-the-Grid Compressive Sensing for Broken-Rotor-Bar Fault Detection in Squirrel-Cage Induction Motors", IFAC-PAPERSONLINE, vol. 48, No. 21, Jan. 1, 2015 (Jan. 1, 2015), pp. 1451-1456.

European Search Report Application No. EP17169903 Completed: Nov. 14, 2017;dated Nov. 27, 2017 9 pages.

Hongzhong Ma et al: "Analysis of induction machines under rotor end-ring faults", Power Engineering Conference, 2007. IPEC 2007. International, IEEE, Piscataway, NJ, USA, Dec. 3, 2007 (Dec. 3, 2007), pp. 1251-1256.

Ramana D Venkata, et al: "Diverse fault detection techniques of three-phase induction motor—A review", 2016 International Conference on Emerging Technological Trends (ICETT), IEEE, Oct. 21, 2016 (Oct. 21, 2016), pp. 1-8.

Toliyat, Hamid A, et al., "Transient Analysis of Cage Induction Machines Under Stator, Rotor Bar and End Ring Faults", IEEE Transactions on Energy Conversion, vol. 10, No. 2, Jun. 1995, pp. 241-247.

European Office Action; Application No. 17 169 903.6; dated Feb. 7, 2022; 6 Pages.

* cited by examiner

METHOD AND A DIAGNOSTICS DEVICE FOR DETERMINING A FAULT CONDITION IN A SYNCHRONOUS MOTOR

TECHNICAL FIELD

The present disclosure generally relates to synchronous machines. In particular, it relates to condition monitoring of synchronous motors.

BACKGROUND

Condition monitoring of synchronous motors is an increasing field, because it allows for detecting synchronous motor faults before a catastrophic failure occurs. Catastrophic failures may thereby be avoided, saving considerable time and costs for a synchronous motor owner/operator.

A number of conditions of a synchronous motor may be determined by measuring the currents and voltages present in a synchronous motor. It has for example previously been shown in EP2919026 A1 that static eccentricity faults and rotor short circuits may be determined based on field current and shaft voltage measurements.

In addition to the above-mentioned type of faults, also the damper bars of a synchronous motor may be subjected to damages. The damper bars are axially extending metal bars which form part of the electric circuit of the synchronous machine. Each damper bar has a first end that is attached to a first end ring and a second end that is attached to a second end ring. The damper bars and the end rings form part of a cage-like structure commonly referred to as the damper cage. The damper cage is used for producing a high starting motor torque and for providing damping of radial rotor oscillations during transients. Even though all potential stresses in the damper bars are taken into consideration during the design stage, damper bar damage may still occur due to residual stresses and hard duty cycles.

In the publication "Transient-based analysis for the detection of broken damper bars in synchronous motors" by J. A. Antonino-Daviu et al., published in Mechanical Systems and Signal Processing, vol. 34, issues 1-2, January 2013, pp. 367-377, the stator start-up current has been used to determine the condition of the damper cage of a synchronous motor. It was however later shown in the paper "Reporting false indications of startup analysis when diagnosing damper damages in synchronous motors", by the same author and published in Industrial Informatics (INDIN), 2016 IEEE 14th International Conference, 19-21 Jul. 2016 that this approach provides false results in the case of salient-pole type synchronous motors.

There is hence no existing solution which can detect damper bar damages for a general synchronous motor.

SUMMARY

In view of the above, an object of the present disclosure is to provide a method of determining fault conditions in a synchronous motor which solves, or at least mitigates, the problems of the prior art.

There is hence according to a first aspect of the present disclosure provided a method of determining a fault condition in a synchronous motor comprising a rotor provided with damper bars and an end ring to which the damper bars are mechanically connected thereby forming a damper cage, wherein the method comprises: obtaining a first measurement of an end ring current from a first location along the end ring, processing the first measurement to thereby obtain a processing result, and determining whether a fault condition is present in the synchronous machine based on the processing result.

Based on the first measurement of the end ring current, a plurality of different synchronous machine fault conditions may be detected, including damper bar faults, inter-turn short-circuits in the stator as well as eccentricity problems of the rotor.

Moreover, because the voltage level in the end ring is close to zero the current sensor, which is configured to measure the end ring current to provide the first measurement, has lower insulation requirements. Lower voltages mean higher safety and the lower insulation requirement means lower costs.

One embodiment comprises obtaining a second measurement of an end ring current from a second location along the end ring, wherein the processing involves comparing the first measurement with the second measurement to thereby obtain the processing result, wherein in the step of determining it is determined that a damper bar fault is present in case the first measurement differs by more than a predetermined amount from the second measurement.

The asymmetry of the poles of a salient pole rotor creates a signature similar to that obtained when a rotor bar fault is present causing the false observations noted in the prior art. By obtaining end current measurements from different locations along the end ring, and comparing them, damper bar faults will be revealed both in steady-state as well as transient operation of the synchronous motor. Damper bar fault detection during steady-state has previously not been possible even for cylindrical rotors.

By comparing the two measurements of the end ring current, obtained from different locations along the end ring, damper bar failures may be detected for any synchronous motor type, including those with a salient pole rotor.

The comparison of the first measurement with the second measurement may involve determining the difference between the first measurement and the second measurement. This may for example involve taking the difference of the root mean square (RMS) of the first measurement and the RMS of the second measurement. If this difference is greater than a predetermined amount or threshold value, a damper bar fault is present.

According to one embodiment the fault condition is one of a damper bar fault, an inter-turn short-circuit in the stator, and a rotor eccentricity problem.

According to one embodiment the first location and the second location are at an angle of 180° from each other. The most apparent indication regarding the presence of a damper bar fault is obtained when the first location and the second location is at an angle of 180° with regards to the circle formed by the end ring. The first location and the second location are in this case located opposite to each other on the end ring. In this case, both broken damper bars as well as damper bar cracks can be detected. If the angle is smaller or greater than 180° a broken damper bar may still be detected, but damper bar cracks will potentially not be detected.

According to one embodiment the processing involves performing a frequency transform of the first measurement to obtain a first spectrum.

According to one embodiment the processing involves comparing the first spectrum with a plurality of fault spectra, each having a signature indicative of a specific fault condition, to thereby obtain the processing result.

The fault spectra may each provide a signature indicate of a specific fault condition such as inter-turn short-circuits in the stator or eccentricity problems of the rotor. Thus, a first fault spectrum of the fault spectra may be an inter-turn short-circuit fault spectrum. A second fault spectrum of the fault spectra may be a rotor eccentricity fault spectrum.

According to one embodiment in the step of determining it is determined that a fault condition is present in case there is a match between the first spectrum and one of the fault spectra. It may thus be detected if an inter-turn short-circuits in the stator or a rotor eccentricity problem is present.

There is according to a second aspect of the present disclosure provided a computer program comprising computer-executable code which when executed by processing circuitry of a diagnostics device to perform the method according to the first aspect.

There is according to a third aspect of the present disclosure provided a computer program product comprising a storage medium including the computer program according to the second aspect.

There is according to a fourth aspect of the present disclosure provided a diagnostics device for determining a fault condition in a synchronous motor comprising a rotor provided with damper bars and an end ring to which the damper bars are mechanically connected thereby forming a damper cage, wherein the diagnostics device comprises: processing circuitry, and a storage medium comprising computer-executable code which when executed by the processing circuitry causes the diagnostics device to: obtain a first measurement of an end ring current from a first location along the end ring, process the first measurement to thereby obtain a processing result, and determine whether a fault condition is present in the synchronous motor based on the processing result.

According to one embodiment the diagnostics device is configured to obtain a second measurement of an end ring current from a second location along the end ring, wherein the diagnostics device is configured to process the first measurement and the second measurement by comparing the first measurement with the second measurement to thereby obtain the processing result, and wherein the diagnostics device is configured to determine that a damper bar fault is present in case the first measurement differs by more than a predetermined amount from the second measurement.

There is according to a fifth aspect of the present disclosure provided a motor diagnostics system comprising: synchronous motor comprising a rotor having a plurality of damper bars and an end ring to which the damper bars are mechanically connected thereby forming a damper cage, a first current sensor configured to measure an end ring current of the end ring, and a diagnostics device according to the fourth aspect configured to receive a first measurement of an end ring current from the first current sensor.

The first current sensor may for example be a Rogowski coil, a Hall sensor or a current transformer. A current transformer is advantageous in that it does not require powering.

One embodiment comprises a second current sensor configured to measure an end ring current of the end ring, wherein the diagnostics device is configured to receive a second measurement of an end ring current from the second current sensor, and wherein the first current sensor is mounted at a first location along the end ring and the second current sensor is mounted at a second location along the end ring.

The second current sensor may for example be a Rogowski coil, a Hall sensor or a current transformer.

As previously mentioned the voltage level in the end ring is close to zero and thus the second current sensor has lower insulation requirements.

According to one embodiment the first location and the second location are at an angle of 180° from each other.

According to one embodiment the rotor is a salient pole rotor.

Generally, all terms used in the claims are to be interpreted according to their ordinary meaning in the technical field, unless explicitly defined otherwise herein. All references to "a/an/the element, apparatus, component, means, etc. are to be interpreted openly as referring to at least one instance of the element, apparatus, component, means, etc., unless explicitly stated otherwise.

BRIEF DESCRIPTION OF THE DRAWINGS

The specific embodiments of the inventive concept will now be described, by way of example, with reference to the accompanying drawings, in which.

DETAILED DESCRIPTION

The inventive concept will now be described more fully hereinafter with reference to the accompanying drawings, in which exemplifying embodiments are shown. The inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description.

Figure 1:
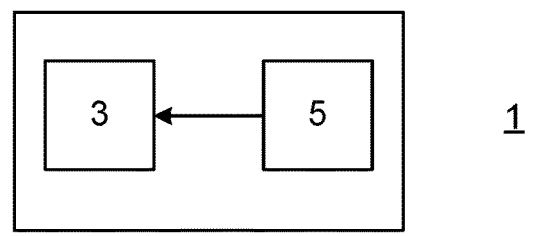
FIG. 1 schematically shows an example of a diagnostics device.

FIG. 1 shows an example of a diagnostics device for determining a fault condition in a synchronous motor. The exemplified diagnostics device 1 comprises processing circuitry 3 and a storage medium 5 comprising computer-executable components which when executed by the processing circuitry 3 causes the diagnostics device 1 to perform the method as disclosed herein.

The processing circuitry 3 uses any combination of one or more of a suitable central processing unit (CPU), multiprocessor, microcontroller, digital signal processor (DSP), application specific integrated circuit (ASIC), field programmable gate arrays (FPGA) etc., capable of executing any herein disclosed operations concerning the determination of a fault condition in a synchronous motor.

The storage medium 5 may for example be embodied as a memory, such as a random access memory (RAM), a read-only memory (ROM), an erasable programmable read-only memory (EPROM), or an electrically erasable programmable read-only memory (EEPROM) and more particularly as a non-volatile storage medium of a device in an external memory such as a USB (Universal Serial Bus) memory or a Flash memory, such as a compact Flash memory.

Figure 2A:
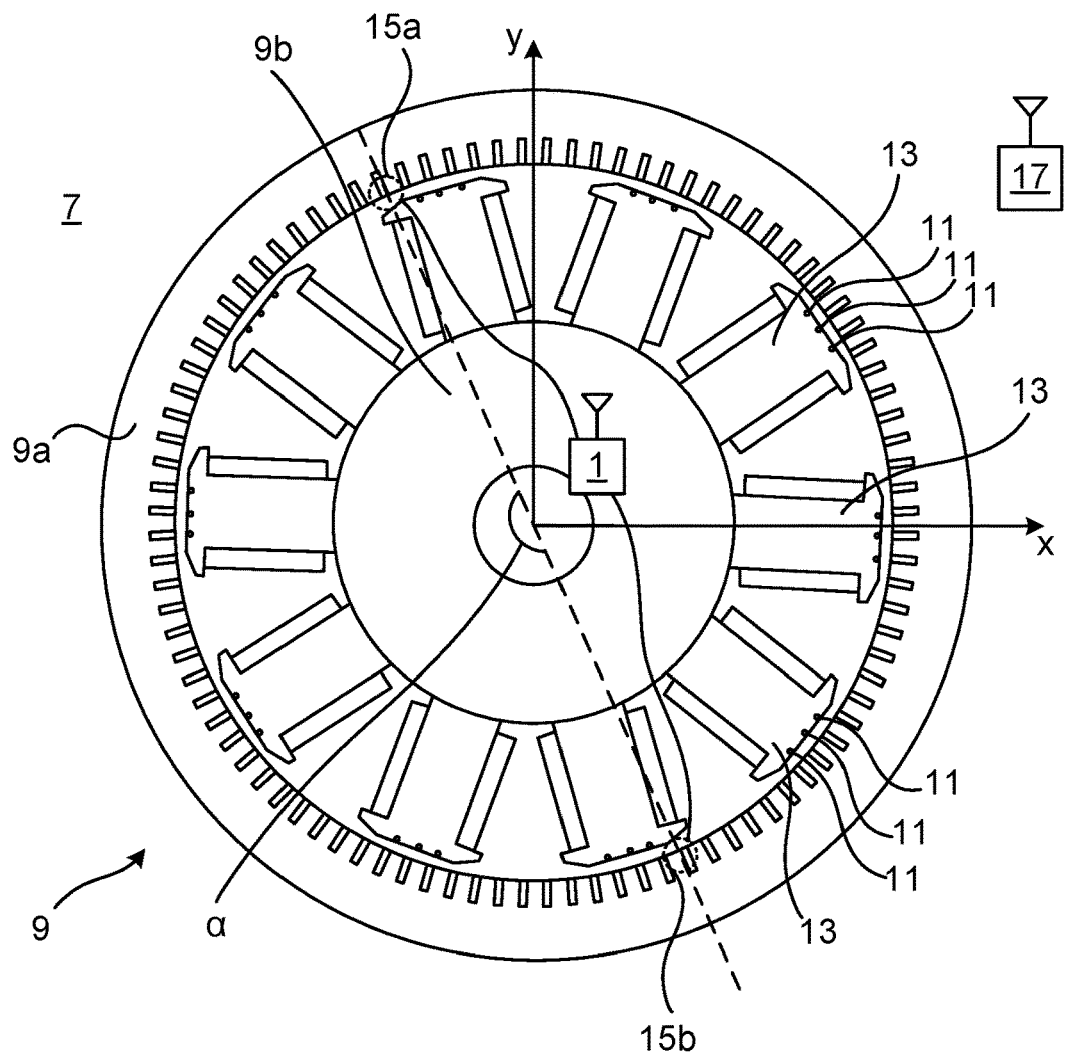
FIG. 2a shows an example of a motor diagnostics system including the diagnostics device in FIG. 1.

FIG. 2a shows one example of a motor diagnostics system 7 comprising a synchronous motor 9 and the diagnostics device 1. The motor diagnostics system 7 depicted in FIG. 2a is designed to enable damper bar fault detection. The synchronous motor 9 comprises a stator 9a and a rotor 9b, of which a cross-section is shown in FIG. 2a. The stator 9a and the rotor 9b are configured to interact electromagnetically.

The rotor 9b comprises a plurality of damper bars 11. The rotor 9b also comprises a plurality of poles 13. According to the present example, the damper bars 11 are arranged in slots in the poles 13. The exemplified rotor 9b is a salient pole rotor. The rotor 9b also includes an end ring, not shown, to which all of the damper bars 11 are mechanically connected. In the context of the present disclosure the end ring does not necessarily need to have the shape of a ring but any element fulfilling the function of short circuiting the damper bars shall be considered to be an end ring irrespective of the shape of the element. That is, for example, a solid plate not having any opening shall be considered to be an end ring if the solid plate short circuits the damper bars. The damper bars 11 and the end ring form a damper cage.

The exemplified motor diagnostics system 7 also comprises a first current sensor 15a provided at a first location along the end ring. The first current sensor 15a is configured to measure an end ring current flowing in the end ring. The motor diagnostics system 7 comprises a second current sensor 15b provided at a second location along the end ring. The second current sensor 15b is configured to measure an end ring current flowing in the end ring. The first location differs from the second location. The first current sensor 15a and the second current sensor 15b are hence arranged at different locations along the end ring. In the x-y coordinate system shown in FIG. 2a, the first current sensor 15a and the second current sensor 15b are spaced apart by an angle α along the end ring. According to the example in FIG. 2a the angle α is 180°. The angle α could alternatively be less than 180°.

In the present example, the diagnostics device 1 is arranged on the rotor 9b. The diagnostics device 1 is connected to the first current sensor 15a. The diagnostics device 1 is thereby able to obtain a first measurement of an end ring current from the first current sensor 15a. The diagnostics device 1 is connected to the second current sensor 15b. The diagnostics device 1 is thereby able to obtain a second measurement of an end ring current from the second current sensor 15b. The diagnostics device 1 is configured to perform the method as disclosed herein, and wirelessly transmit the result to a base device 17 located at a distance from the synchronous motor 9. This enables an operator using the base device 17 to observe whether a fault condition is present in the synchronous motor 9.

In the example shown in FIG. 2a the diagnostics device 1 may be configured to be powered by the rotor 9b. The diagnostics device 1 may for example be powered by the exciter winding of the rotor 9b.

As an alternative, the location of the diagnostics device 1 and the base device 17 may be switched. In this case, the base device is arranged on the rotor and configured to receive the first measurement from the first current sensor and the second measurement from the second current sensor. The base device will in this case transmit the first measurement and the second measurement to the diagnostics device located at a distance from the synchronous motor. The method is then carried out by the diagnostics device at a distance from the synchronous motor.

An example of a method of determining a fault condition in a synchronous motor by means of the motor diagnostics system 7 will now be described. In this example, the diagnostics device 1 is able to determine a damper bar fault.

Figure 3:
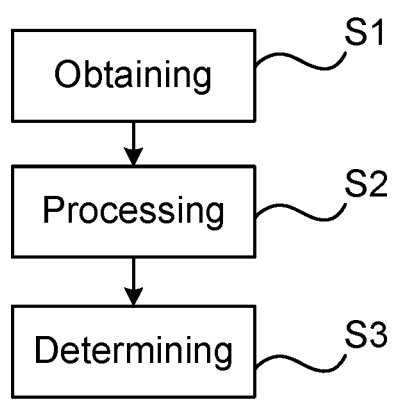
FIG. 3 shows a general method of determining a fault condition in a synchronous motor.

With reference to FIG. 3, in a step S1 a first measurement of an end ring current is obtained by the diagnostics device 1. The first measurement is made by the first current sensor 15a. Moreover, a second measurement of an end ring current is obtained by the diagnostics device 1. The second measurement is made by the second current sensor 15b.

In a step S2, the first measurement and the second measurement are processed by the diagnostics device 1 to thereby obtain a processing result. The processing involves comparing the first measurement with the second measurement. The comparing may involve taking the difference of the RMS of the first measurement and the RMS of the second measurement, or determining a ratio between the RMS of the first measurement and the RMS of the second measurement.

In a step S3 it is determined whether a fault condition is present in the synchronous motor 9 based on the processing result obtained in step S2. It can thereby be determined whether a damper bar fault is present. In case the first measurement and the second measurement differ by more than a predetermined amount or threshold value it is determined in step S3 that a damper bar fault is present.

Figure 2B:
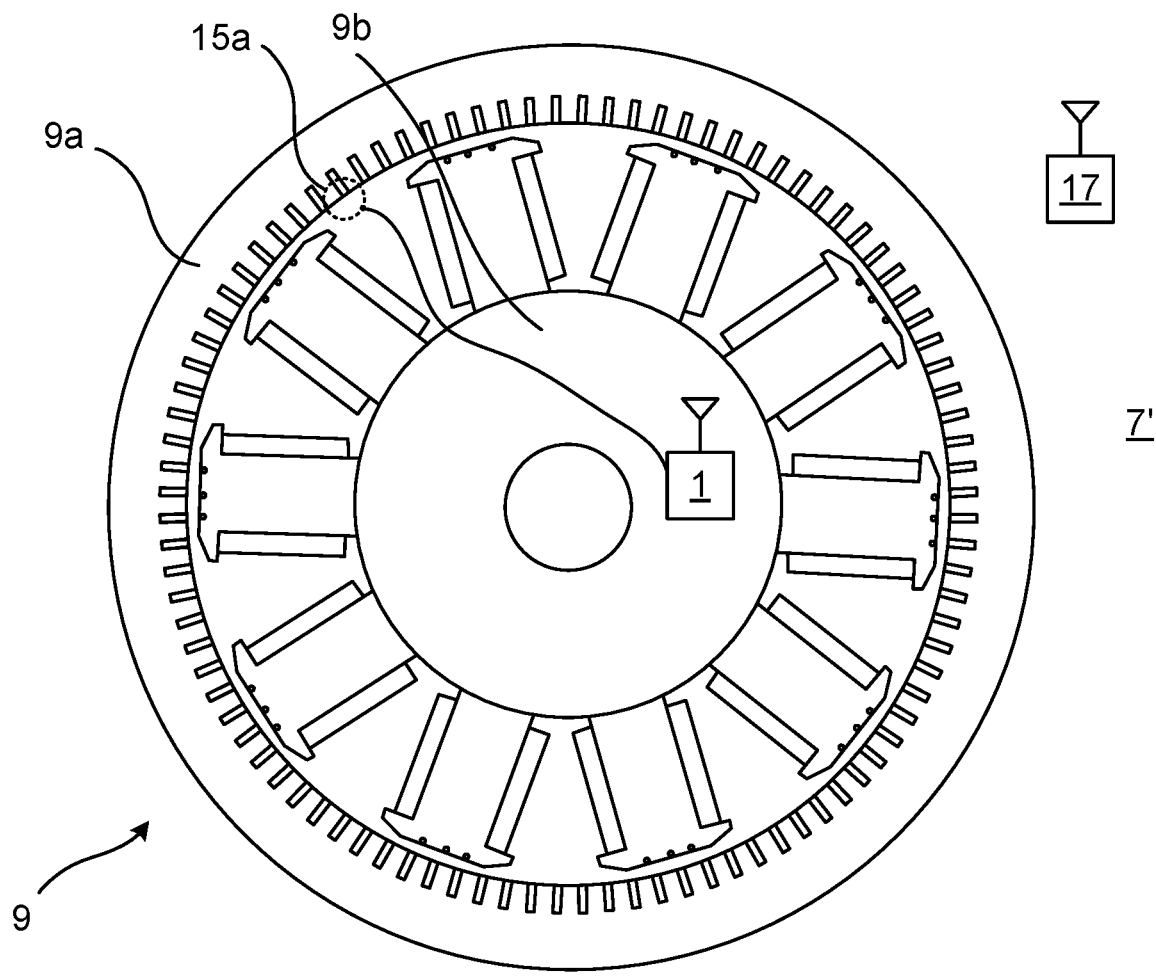
FIG. 2b shows another example of a motor diagnostics system including the diagnostics device in FIG. 1.

FIG. 2b shows another example of a motor diagnostics system. The motor diagnostics system 7' comprises a synchronous motor 9 as described in the example above, and the diagnostics device 1. A difference between the two motor diagnostics systems is that the motor diagnostics system 7' only comprises one current sensor. Hence, motor diagnostics system 7' comprises the first current sensor 15a configured to measure an end ring current of the end ring. Again, the diagnostics device 1 may be arranged on the rotor 9b or at a distance from the synchronous motor 9.

An example of a method of determining a fault condition in a synchronous motor by means of the motor diagnostics systems 7' will now be described. In this example, the diagnostics device 1 is able to determine an inter-turn short-circuit fault and a rotor eccentricity fault. It is to be noted that the motor diagnostics systems 7 may also be able to perform this method, using only one of the first measurement and the second measurement.

With reference to FIG. 3, in a step S1 a first measurement of an end ring current made by the first current sensor 15a is obtained by the diagnostics device 1.

In a step S2, the first measurement is processed to thereby obtain a processing result. In this example, the processing involves performing a frequency transform of the first measurement to obtain a first spectrum. The frequency transform may for example be a Fourier transform such as the Fast Fourier Transform (FFT) or any other applicable frequency transform.

Figure 4:
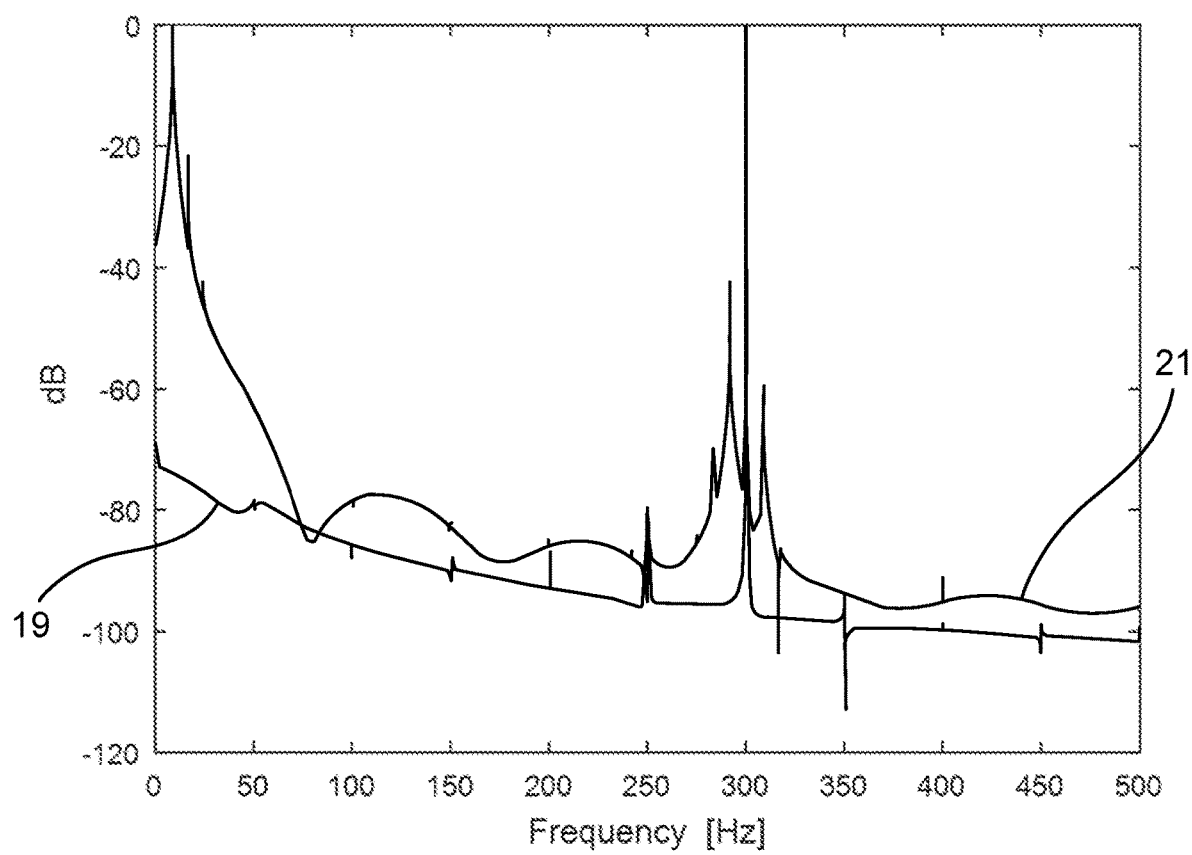
FIG. 4 shows an example a fault spectrum for a rotor eccentricity fault.

The processing furthermore involves comparing the first spectrum with a plurality of fault spectra. In this manner the processing result may be obtained. Each fault spectrum has a signature indicative of a specific fault condition. For example, a first fault spectrum of the fault spectra may be an inter-turn short-circuit fault spectrum and a second fault spectrum of the fault spectra may be a rotor eccentricity fault spectrum. As an example, FIG. 4 shows a plot 19 of a healthy spectrum of the end ring current when neither an inter-turn short-circuit fault nor a rotor eccentricity fault is present, and a plot 21 of a spectrum of the end ring current in the presence of a rotor eccentricity fault.

In a step S3 it determined whether a fault condition is present in the synchronous motor based on the processing result obtained in step S2. In particular it is determined that a fault condition is present in case there is a match between the first spectrum and one of the fault spectra. This matching may for example involve detecting the presence of one or more signature frequency peaks in first spectrum, also present in one of the fault spectra and being defining for identifying a specific fault condition.

The inventive concept has mainly been described above with reference to a few examples. However, as is readily appreciated by a person skilled in the art, other embodiments than the ones disclosed above are equally possible within the scope of the inventive concept, as defined by the appended claims.

What is claimed is:

1. A method of determining a fault condition in a synchronous motor comprising a rotor provided with damper bars and an end ring to which the damper bars are mechanically connected thereby forming a damper cage, wherein the method comprises:
   obtaining a first measurement of an end ring current from a first location along the end ring,
   processing the first measurement to thereby obtain a processing result, and
   determining whether a fault condition is present in the synchronous motor based on the processing result.

2. The method as claimed in claim 1, wherein the fault condition is a damper bar fault.

3. The method as claimed in claim 2, comprising obtaining a second measurement of an end ring current from a second location along the end ring, wherein the processing involves comparing the first measurement with the second measurement to thereby obtain the processing result, wherein in the step of determining it is determined that a damper bar fault is present in case the first measurement differs by more than a predetermined amount from the second measurement.

4. The method as claimed in claim 2, wherein the processing involves performing a frequency transform of the first measurement to obtain a first spectrum.

5. The method as claimed in claim 1, comprising obtaining a second measurement of an end ring current from a second location along the end ring, wherein the processing involves comparing the first measurement with the second measurement to thereby obtain the processing result, wherein in the step of determining it is determined that a damper bar fault is present in case the first measurement differs by more than a predetermined amount from the second measurement.

6. The method as claimed in claim 5, wherein the first location and the second location are at an angle of 180° from each other.

7. The method as claimed in claim 1, wherein the processing involves performing a frequency transform of the first measurement to obtain a first spectrum.

8. The method as claimed in claim 7, wherein the processing involves comparing the first spectrum with a plurality of fault spectra, each having a signature indicative of a specific fault, to thereby obtain the processing result.

9. The method as claimed in claim 8, wherein in the step of determining it is determined that a fault condition is present in case there is a match between the first spectrum and one of the fault spectra.

10. The method as claimed in claim 1, wherein the fault condition is an inter-turn short-circuit in the stator or a rotor eccentricity problem.

11. A computer program stored on a non-transitory computer readable medium and comprising computer-executable code which when executed by processing circuitry of a diagnostics device determines a fault condition in a synchronous motor having a rotor provided with damper bars and an end ring to which the damper bars are mechanically connected thereby forming a damper cage, the program including the steps of:
   obtaining a first measurement of an end ring current from a first location along the end ring,
   processing the first measurement to thereby obtain a processing result, and
   determining whether a fault condition is present in the synchronous motor based on the processing result.

12. A computer program product comprising a non-transitory computer readable storage medium including a computer program having computer-executable code which when executed by processing circuitry of a diagnostics device determines a fault condition in a synchronous motor having a rotor provided with damper bars and an end ring to which the damper bars are mechanically connected thereby forming a damper cage, the program including the steps of:
   obtaining a first measurement of an end ring current from a first location along the end ring,
   processing the first measurement to thereby obtain a processing result, and
   determining whether a fault condition is present in the synchronous motor based on the processing result.

13. A diagnostics device for determining a fault condition in a synchronous motor comprising a rotor provided with damper bars and an end ring to which the damper bars are mechanically connected thereby forming a damper cage, wherein the diagnostics device comprises:
   processing circuitry, and
   a storage medium comprising computer-executable code which when executed by the processing circuitry causes the diagnostics device to:
   obtain a first measurement of an end ring current from a first location along the end ring,
   process the first measurement to thereby obtain a processing result, and
   determine whether a fault condition is present in the synchronous motor based on the processing result.

14. The diagnostics device as claimed in claim 13, wherein the diagnostics device is configured to obtain a second measurement of an end ring current from a second location along the end ring, wherein the diagnostics device is configured to process the first measurement and the second measurement by comparing the first measurement with the second measurement to thereby obtain the processing result, and wherein the diagnostics device is configured to determine that a damper bar fault is present in case the first measurement differs by more than a predetermined amount from the second measurement.

15. A motor diagnostics system comprising:
   a synchronous motor comprising a rotor having a plurality of damper bars and an end ring to which the damper bars are mechanically connected thereby forming a damper cage,
   a first current sensor configured to measure an end ring current of the end ring, and
   a diagnostics device configured to determine a fault condition in the synchronous motor, the diagnostics device having processing circuitry and a storage medium comprising computer-executable code which when executed by the processing circuitry causes the diagnostics device to:
   obtain a first measurement of the end ring current from a first location along the end ring,
   process the first measurement to thereby obtain a processing result, and determine whether a fault condition is present in the synchronous motor based on the processing result, wherein the diagnostics device is configured to receive the first measurement of the end ring current from the first current sensor.

16. The motor diagnostics system as claimed in claim 15, comprising a second current sensor configured to measure an end ring current of the end ring, wherein the diagnostics device is configured to receive a second measurement of an end ring current from the second current sensor, and wherein the first current sensor is mounted at a first location along the end ring and the second current sensor is mounted at a second location along the end ring.

17. The motor diagnostics system as claimed in claim 16, wherein the first location and the second location are at an angle of 180° from each other.

18. The motor diagnostics system as claimed in claim 16, wherein the rotor is a salient pole rotor.

19. The motor diagnostics system as claimed in claim 17, wherein the rotor is a salient pole rotor.

20. The motor diagnostics system as claimed in claim 15, wherein the rotor is a salient pole rotor.

* * * * *